United States Patent [19]
Usami et al.

[11] Patent Number: 5,424,253
[45] Date of Patent: Jun. 13, 1995

[54] METHOD FOR MANUFACTURING AN INTER-LAYER INSULATING FILM

[75] Inventors: Takashi Usami; Masaki Yoshimaru; Kimiaki Shimokawa, all of Tokyo, Japan

[73] Assignee: Oki Electric Industry Co., Ltd., Tokyo, Japan

[21] Appl. No.: 26,291

[22] Filed: Mar. 4, 1993

[30] Foreign Application Priority Data

Mar. 9, 1992 [JP] Japan .................. 4-050745

[51] Int. Cl.6 .................. H01L 21/316; H01L 21/318
[52] U.S. Cl. ..................................... 437/238; 437/241
[58] Field of Search ................................ 437/238, 241

[56] References Cited

U.S. PATENT DOCUMENTS

4,762,728  8/1988  Keyser et al. .................. 429/569
4,872,947  10/1989  Wang et al. .................. 156/643

FOREIGN PATENT DOCUMENTS

0076866  5/1982  Japan .................. 437/241
0047135  2/1987  Japan .................. 437/241

OTHER PUBLICATIONS

H. Kotani et al., "Low-Temperature APCVD Oxide Using TEOS-Ozone Chemistry For Multilevel Interconnections", 1989, IEDM 89, IEEE, pp. 28.2.1–28.2.4.

M. Matsuura et al., "Substrate-Dependent Characteristics of APCVD Oxide Using TEOS and Ozone" (Extended Abstracts of the 22nd (1990 International) Conference on Solid State Devices and Materials, Sendai, 1990, pp. 239–242.

*Primary Examiner*—R. Bruce Breneman
*Attorney, Agent, or Firm*—Steven M. Rabin

[57] ABSTRACT

A method for manufacturing an inter-layer insulating film (ex. $O_3$, TEOS or NSG) with a superior surface flatness is disclosed to solve the problem that the surface of the inter-layer film formed on a certain under-layer substrate reveals roughness due to the influence of the substrate. It is provided a method for manufacturing $O_3$ TEOS NSG film after doping nitrogen (N) atoms into the under-layer films, or after forming the under-layer films which contain nitrogen (N) atoms therein.

16 Claims, 2 Drawing Sheets

METHOD FOR MANUFACTURING AN INTER-LAYER INSULATING FILM

BACKGROUND OF THE INVENTION

1. Field of the Invention

The present invention relates to a method for manufacturing an inter-layer insulating film applied to a semiconductor device and, more particularly, to a method for reducing the effect of an under-layer substrate on which a silicon dioxide ($SiO_2$) inter-layer film is formed with a chemical vapor deposition (CVD) using as source gases an ozone ($O_3$) and a tetraethoxysilane(TEOS).

2. Related Arts

A high density integration technology has been remarkably developed particularly in semiconductor devices. A stacked layer structure has been widely employed in semiconductor devices to accomplish the high density integration in a restricted area. These semiconductor devices require flatness on the surface of the inter-layer insulating film because, if the surface is formed roughly, it becomes difficult for subsequent manufacturing steps to process the inter-layer film and its upper layer film, which causes a reduced yield of semiconductor devices.

A NSG (Non-doped Silicate Glass) film, which is manufactured by CVD utilizing the reaction of TEOS, has recently been used as an inter-layer insulating film revealing excellent flatness.

However, the growth of $O_3$-TEOS NSG film is highly influenced depending on the under-layer film. Some of the under-layer films create abnormally grown $O_3$-TEOS NSG film thereon, which may reveal roughness of the surface, losing inherent quality of flatness of $O_3$-TEOS NSG film.

SUMMARY OF THE INVENTION

It is a primary object of the present invention to provide a method for manufacturing an inter-layer insulating film showing an excellent flatness on its surface.

It is another object of the invention to provide a method for solving the problem that the surface of $O_3$-TEOS NSG film formed on a certain under-layer substrate reveals roughness due to the influence of the substrate.

To accomplish the above objects, it is provided a method for manufacturing $O_3$-TEOS NSG film after doping nitrogen (N) atoms into the under-layer films. It is also provided a method for manufacturing $O_3$-TEOS NSG film on a surface of an insulating film, which is formed as an under-layer film, containing nitrogen (N) atoms therein.

DETAILED DESCRIPTION OF THE PREFERRED EMBODIMENTS

The first to tenth embodiments of the invention will be hereinafter explained in details referring to FIGS. 1-5.

Figure 1:
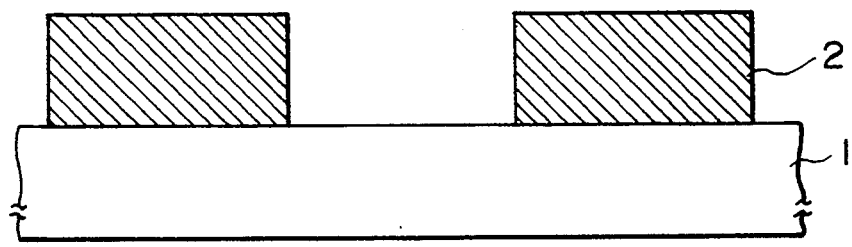
FIG. 1 is a cross-sectional view illustrating the first intermediate process step commonly shown through the first to tenth embodiments of the invention.

FIG. 1 is a cross-sectional view illustrating the first process step commonly shown in all the embodiments of the invention, in which a gate electrode 2 made of polysilicon is formed on the surface of a semiconductor substrate 1. This process step will be further explained in detail.

Firstly, the substrate 1 is prepared and disposed in a chamber (not shown).

Figure 2:
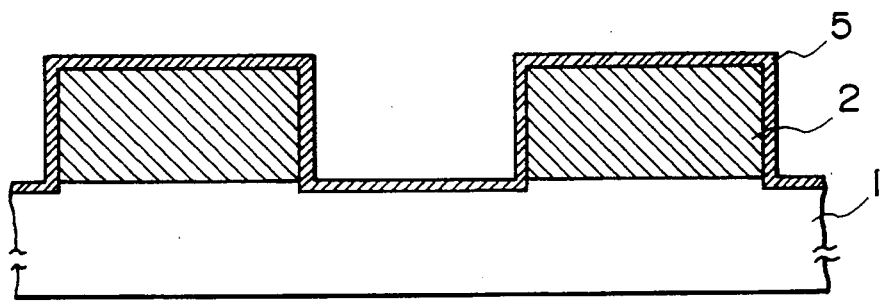
FIG. 2 is a cross-sectional view illustrating the second intermediate process step commonly shown in the first and second embodiments of the invention.

Secondly, a $SiH_4$ or a $Si_2H_6$ gas is introduced into the chamber with heating the substrate 1 at 590°-630° C. in temperature and at 0.1-0.5 Torr in pressure to form the polysilicon 2 with 4,000 Å in thickness on the substrate 1. FIG. 2 is a cross-sectional view illustrating the second process step commonly shown in the first and second embodiments of the invention. As illustrated in FIG. 2, nitrogen atoms (N) are introduced into the exposed regions of the substrate 1 and the gate electrode 2, both of which are shown in FIG. 1, so as to form an under-layer film 5. The under-layer film 5 of the first embodiment is formed by the substrate 1 and the gate electrode 2 being exposed with a gas plasma generated by using at least one kind of gas selected from among $NH_3$, $N_2O$ and $N_2$ gases. This formation process will be further explained in detail hereinafter.

The substrate 1 is disposed in a chamber of a parallel plate type plasma equipment, and at least one gas selected among $NH_3$, $N_2O$ and $N_2$ gases is introduced into the chamber to form the under-layer film 5 under conditions of 200°-500° C. in temperature, 1-10 Torr in pressure and 0.5-3 W/cm$^2$ in RF power supply. In case a single pure gas is utilized, the preferable gas flow rate for each of the gases is recommended to be set at 50-200 cc/min in case of $NH_3$, 300-500 cc/min in case of $N_2O$ and 1,000-2,000 cc/min in case of $N_2$, respectively. In case a gas mixture is utilized, the gas flow rate of respective gases needs to be well adjusted. The under-layer film 5 of the second embodiment is formed by ion implanting at least one kind of gas selected from among $NH_3$, $N_2O$ and $N_2$ into the substrate 1 and the gate electrode 2.

Figure 3:
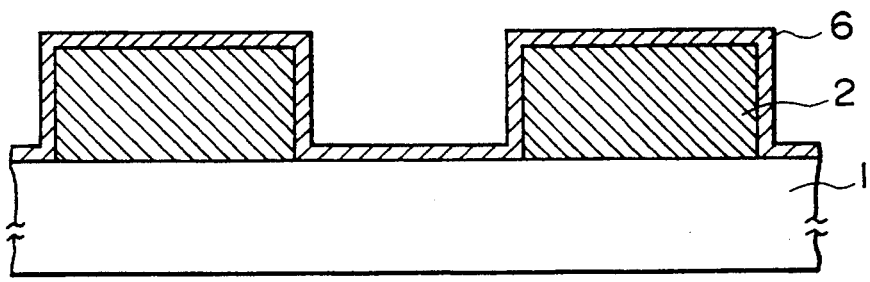
FIG. 3 is a cross-sectional view illustrating the second intermediate process step commonly shown through the third to sixth embodiments of the invention.

The above ion implantation is conducted under conditions of $10^{-6}$-$10^{-7}$ Torr in pressure, 5-20 KeV in acceleration energy and 5-10 mA in beam current. The total amount of N$^+$ ions accumulated on the under-layer films by ion implantation is preferably set to be approximately $1 \times 10^{17}$-$9 \times 10^{17}$ ions/cm$^2$. FIG. 3 is a cross-sectional view illustrating the second process step commonly shown through the third to sixth embodiments of the invention, in which an insulating film 6 containing nitrogen (N) atoms is formed on the substrate 1 and the gate electrode 2 both shown in FIG. 1.

The third embodiment employs a silicon nitride ($Si_3N_4$) film as the insulating film 6 containing N atoms manufactured with an LPCVD method. The $Si_3N_4$ film is formed in such a manner that the substrate 1 is disposed in a chamber and a gas mixture of either $SiH_4+NH_3$ or $SiH_2Cl_2+NH_3$ is introduced into the chamber as a source gas under conditions of 0.05–1 Torr in pressure and 600°–800° C. in temperature.

The mass flow rate of the source gas is preferably set as 50–300 cc/min of $SiH_4$ and 50–500 cc/min of $NH_3$ in combination or 50–300 cc/min of $SiH_2Cl_2$ and 50–500 cc/min of $NH_3$ in combination. The $Si_3N_4$ film is preferably set to be approximately in a range of 500–2000 Å in thickness.

The fourth embodiment employs a SiON film as the insulating film 6 containing N atoms therein manufactured with the LPCVD method. The SiON film is formed in such a manner that the substrate 1 is disposed in a chamber and a gas mixture of either $SiH_4+NH_3+N_2O$ or $SiH_2Cl_2+NH_3+N_2O$ is introduced into the chamber as a source gas under conditions of 0.05–1 Torr in pressure and 600°–800° C. in temperature. The mass flow rate of the source gas is preferably set as 50–300 cc/min of $SiH_4$, 50–500 cc/min of $NH_3$ and 50–500 cc/min of $N_2O$ in combination or 50–300 cc/min of $SiH_2Cl_2$, 50–500 cc/min of $NH_3$ and 50–500 cc/min of $N_2O$ in combination. The SiON film is preferably set to be approximately in a range of 500–2000 Å in thickness.

The fifth embodiment employs a SiN film as the insulating film 6 containing N atoms manufactured with a plasma CVD method.

The SiN film is formed in such a manner that the substrate 1 is disposed in a chamber and a gas mixture of either $SiH_4+NH_3+N_2$ or $SiH_4+N_2$ is introduced into the chamber as a source gas under conditions of 1–10 Torr in pressure, 200°–500° C. in temperature and 0.5–3 $W/cm^2$ in RF power supply. The mass flow rate of the source gas is preferably set as 100–200 cc/min of $SiH_4$, 30–100 cc/min of $NH_3$ and 1,000–3,000 cc/min in combination or 100–200 cc/min of $SiH_4$ and 1,000–3,000 cc/min of $N_2$ in combination. The SiN film is preferably set to be approximately in a range of 500–2,000 Å in thickness.

The sixth embodiment employs a SiON film as the insulating film 6 containing N atoms manufactured with a plasma CVD method.

The SiON film is formed in such a manner that the substrate 1 is disposed in a chamber and a gas mixture of $SiH_4+NH_3+N_2O$ is introduced into the chamber as a source gas under conditions of 1–10 Torr in pressure, 200°–500° C. in temperature and 0.5–3 $W/cm^2$ in RF power supply.

The mass flow rate of the source gas is preferably set as 100–200 cc/min of $SiH_4$, 30–100 cc/min of $NH_3$ and 1,000–3,000 cc/min of $N_2O$ in combination. The SiON film is preferably set to be approximately in a range of 500–2,000 Å in thickness.

Figure 4:
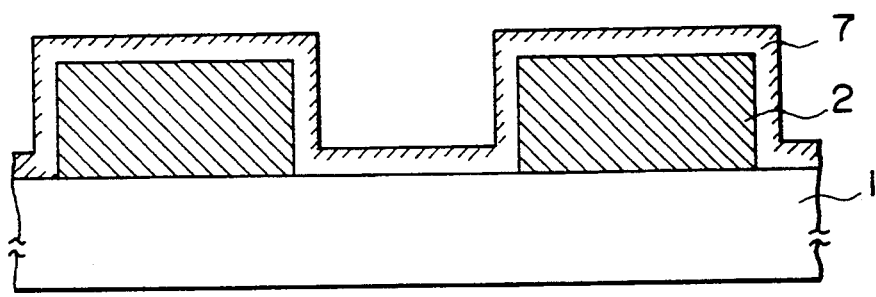
FIG. 4 is a cross-sectional view illustrating the second intermediate process step commonly shown through the seventh to tenth embodiments of the invention.

FIG. 4 is a cross-sectional view illustrating the second process step commonly shown through the seventh to tenth embodiments of the invention, in which an insulating film 7 containing N atoms is formed on the substrate 1 and the gate electrode 2 both shown in FIG. 1. The insulating film 7 is formed by introducing N atoms into a non-doped $SiO_2$ film which is in advance formed on the substrate 1 and the gate electrode 2.

The insulating film 7 containing N atoms of the seventh embodiment is formed by the non-doped $SiO_2$ film, which is in advance manufactured by an APCVD method, being exposed with a gas plasma generated by using at least one kind of gas selected from among $NH_3$, $N_2O$ and $N_2$ gases.

The non-doped $SiO_2$ film is formed in such a manner that the substrate 1 is disposed in a chamber and a gas mixture either of $O_2$ (including $O_3$)+TEOS or of $SiH_4+O_2$ is introduced as a source gas into the chamber under conditions of 300°–500° C. in temperature at atmospheric pressure.

The mass flow rate of the source gas is preferably set as 5–10 l/min of $O_2$ (the concentration rate of $O_3$ is 10–75 $g/m^3$) and 1–3 l/min of TEOS in combination or 10–50 cc/min of $SiH_4$ and 100–300 cc/min of $O_2$ in combination. The non-doped $SiO_2$ film is also preferably set to fall into a range of 500–2,000 Å in thickness. The non-doped $SiO_2$ film foraged in such a manner described above is exposed with gas plasma generated with at least one kind of gas selected from among $NH_3$, $N_2O$ and $N_2$. The conditions under which the gas plasma is generated are same as those described in the first embodiment.

The insulating film 7 containing N atoms of the 8th embodiment is formed by ion implanting at least one kind of gas selected from $NH_3$, $N_2O$ and $N_2$ into a non-doped $SiO_2$ film which is in advance formed on the substrate 1 and the gate electrode 2 by an APCVD method. The conditions under which the non-doped $SiO_2$ film is formed are same as those described in the seventh embodiment and the conditions of the ion implantation are also same as those described in the second embodiment.

The insulating film 7 containing N atoms of the ninth embodiment is formed by the non-doped $SiO_2$ film, which is in advance manufactured with a plasma CVD method, being exposed with a gas plasma generated by using at least one kind of gas selected from among $NH_3$, $N_2O$ and $N_2$ gases.

The non-doped $SiO_2$ film 7 is formed in such a manner that the substrate 1 is disposed in a chamber and a gas mixture either of $O_2+TEOS$ or of $SiH_4+N_2O$ is introduced as a source gas into the chamber under conditions of 1–20 Torr in pressure, 200°–500° C. in temperature and 0.5–3 $W/cm^2$ in RF power supply.

The mass flow rate of the source gas is preferably set as 100–1,000 cc/min of $O_2$ and 100–1,000 cc/min of TEOS in combination or 50–100 cc/min of $SiH_4$ and 1,000–2,000 cc/min of $N_2O$ in combination.

The non-doped $SiO_2$ film is also preferably set to fall into a range of 500–2,000 Å in thickness. The non-doped $SiO_2$ film formed in such a manner described above is exposed with gas plasma generated with at least one kind of gas selected from among $NH_3$, $N_2O$ and $N_2$. The conditions under which the gas plasma is generated are the same as those described in the first embodiment.

The insulating film containing N atom of the tenth embodiment is formed by the non-doped $SiO_2$ film, which is in advance manufactured by a plasma CVD method, being ion implanted with at least one kind of gas selected from $NH_3$, $N_2O$ and $N_2$.

The conditions under which the non-doped $SiO_2$ film is formed are same as those described in the ninth embodiment and the conditions of the ion implantation are same as those in the second embodiment.

Figure 5:
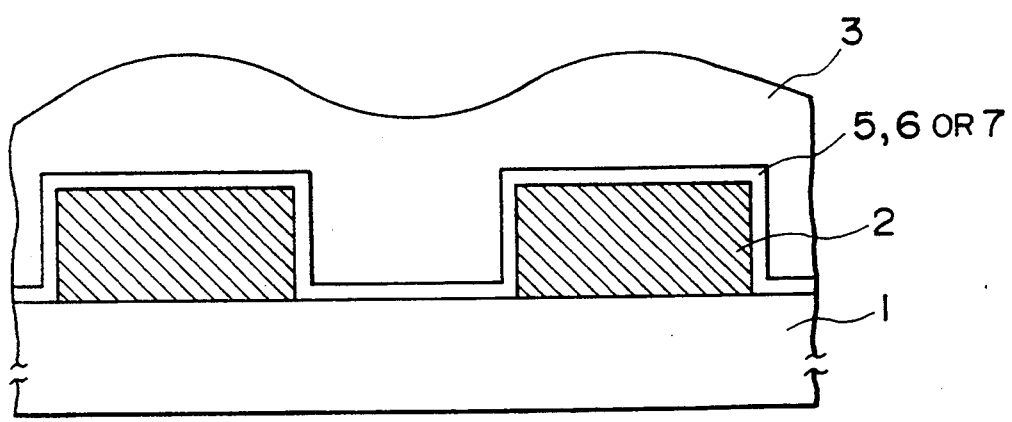
FIG. 5 is a cross-sectional view illustrating the final process step commonly shown through the first to tenth embodiment of the invention.

FIG. 5 is a cross-sectional view illustrating the final process step of the invention.

As described in the first through tenth embodiments, the $O_3$ TEOS NSG film 3 with 5,000–10,000 Å in thickness are formed by a CVD method on the surface either of the under-layer film 5 in which N atoms are introduced or of the insulating films 6, 7 in which N atoms are contained. The TEOS or NSG film 3 is formed by the substrate 1 shown in FIG. 2–4 being processed under conditions of the mass flow rates of TEOS and $O_2$ containing $O_3$ being 1–2 l/min and 5–10 l/min, respectively, 75–130 g/m$^3$ of O$_3$ in concentration, 350°–450° C. in temperature and 300–760 Torr in pressure.

The growth of films of O$_3$-TEOS NSG is not influenced by the under-layer film when the method described above is utilized.

As a result, a stabilized flatness can be achieved on the surface of O$_3$-TEOS NSG film.

Although persuasive reasons why the stabilized flatness can be achieved on the surface of O$_3$-TEOS NSG film have not been well found, the following two reasons would be most likely.

The first reason would be that since the surface of the under-layer insulating film reveals a waterproof feature because the film contains N atoms so that intermediate materials which also reveal a waterproof feature formed by gas phase reaction of O$_3$ with TEOS can be easily adhered to the surface of the under-layer film. As a result, the growth of O$_3$-TEOS NSG film is not influenced by the under-layer film.

The second reason would be that since the surface of the under-layer insulating film is positively charged because the film contains N atoms so that intermediate materials formed by gas phase reaction of O$_3$ with TEES, the surface of which is negatively charged, can be easily adhered to the surface of the under-layer film. Accordingly, the growth of O$_3$-TEOS NSG film is not influenced by the under-layer film.

We claim:

1. A method for manufacturing an inter-layer insulating film comprising steps of:
   (a) preparing a semiconductor substrate;
   (b) forming a semiconductor material layer on a surface of the semiconductor substrate;
   (c) forming an under-layer in which nitrogen (N) atoms are introduced into the semiconductor substrate and the semiconductor material layer; and
   (d) forming a SiO$_2$ film as an inter-layer insulating film on the under-layer with a chemical vapor deposition (CVD) method utilizing a reaction of ozone (O$_3$) with tetraethoxy-silane (TEOS).

2. The method set forth in claim 1, wherein the step of forming the under-layer is performed in such a manner that the semiconductor substrate and the semiconductor material layer are exposed to a gas plasma generated by at least one gas selected from among NH$_3$, N$_2$O and N$_2$.

3. The method set forth in claim 1, wherein the step of forming the under-layer is performed in such a manner that at least one gas selected from among NH$_3$, N$_2$O and N$_2$ is ion-implanted into the semiconductor substrate and the semiconductor material layer.

4. The method set forth in claim 1, wherein the step of forming the SiO$_2$ film is performed in such a manner that the semiconductor substrate and semiconductor material layer in which the under-layer is formed are processes so as to form the SiO$_2$ film to have a thickness of 5,000–10,000 Å, utilizing the CVD method under conditions of:
   (i) a mass flow rate of the TEOS being 1–2 l/min;
   (ii) a mass flow rate of an oxygen containing an ozone (O$_3$) being 5–10 l/min;
   (iii) a concentration of the O$_3$ being 75–130 g/m$^3$;
   (iv) a substrate temperature being 350°–450° C.; and
   (v) a pressure being 300 Torr—Atmospheric pressure.

5. A method for manufacturing an inter-layer insulating film comprising steps of:
   (a) preparing a semiconductor substrate;
   (b) forming an element on the semiconductor substrate;
   (c) forming an insulating film containing N atoms as an under-layer on the semiconductor substrate and the element; and
   (d) forming a first SiO$_2$ film as an inter-layer insulating film on the under-layer with a chemical vapor deposition (CVD) utilizing a reaction of ozone (O$_3$) with tetraethoxy-silane (TEOS).

6. The method set forth in claim 5, wherein the step of forming the insulating film is performed in such a manner that a low pressure chemical vapor deposition (LPCVD) method is applied which utilizes as a source gas either a gas mixture of SiH$_4$ and NH$_3$ or a gas mixture of SiH$_2$Cl$_2$ and NH$_3$.

7. The method set forth in claim 5, wherein the step of forming the insulating film is performed in such a manner that a LPCVD method is applied which utilizes as a source gas either a gas mixture of SiH$_4$, NH$_3$ and N$_2$O in combination or a gas mixture of SiH$_2$Cl$_2$, NH$_3$ and N$_2$O.

8. The method set forth in claim 5, wherein the step of forming the insulating film is performed in such a manner that a plasma CVD method is applied which utilizes as a source gas either a gas mixture of SiH$_4$, NH$_3$ and N$_2$ or a gas mixture of SiH$_4$ and N$_2$ in combination.

9. The method set forth in claim 5, wherein the step of forming the insulating film is performed in such a manner that a plasma CVD method is applied which utilizes as a source gas a gas mixture of SiH$_4$, NH$_3$ and N$_2$O.

10. The method set forth in claim 5, wherein the step of forming the insulating film comprises following steps of:
    (i) forming a second SiO$_2$ film with an atmospheric pressure (AP) CVD method utilizing as a source gas either a gas mixture of O$_2$ containing O$_3$ and TEOS in combination or a gas mixture of SiH$_4$ and O$_2$; and
    (ii) exposing the second SiO$_2$ film to a gas plasma generated with at least one kind of gas selected from among NH$_3$, N$_2$O and N$_2$.

11. The method set forth in claim 5, wherein the step of forming the insulating film comprises following steps of:
    (i) forming a second SiO$_2$ film with an APCVD method utilizing as a source gas either a gas mixture of O$_2$ containing O$_3$ and TEOS or a gas mixture of SiH$_4$ and O$_2$; and
    (ii) ion-implanting at least one kind of gas selected from among NH$_3$, N$_2$O and N$_2$ into the second SiO$_2$ film.

12. The method set forth in claim 5, wherein the step of forming the insulating film comprises following steps of:
    (i) forming a second SiO$_2$ film with a plasma CVD method utilizing as a source gas either a gas mixture of SiH$_4$ and N$_2$O or a gas mixture of O$_2$ and TEOS; and
    (ii) exposing the second SiO$_2$ film to a gas plasma generated with at least one kind of gas selected from among NH$_3$, N$_2$O and N$_2$.

13. The method set forth in claim 5, wherein the step of forming the insulating film comprises following steps of:
    (i) forming a second SiO$_2$ film with a plasma CVD method utilizing as a source gas either a gas mixture of SiH$_4$ and N$_2$O or a gas mixture of O$_2$ and TEOS; and (ii) ion-implanting at least one kind of gas selected from among $NH_3$, $N_2O$ and $N_2$ into the second $SiO_2$ film.

14. The method set forth in claim 5, wherein the step of forming the first $SiO_2$ film is performed in such a manner that the semiconductor substrate and the element on which the under-layer is formed are processed so as to form the first $SiO_2$ film to have a thickness of 5,000–10,000 Å, utilizing the CVD method under conditions of:
   (i) a mass flow rate of the TEOS being 1–2 l/min;
   (ii) a mass flow rate of an oxygen containing an ozone ($O_3$) being 5–10 l/min;
   (iii) a concentration of the $O_3$ being 75–130 g/m$^3$;
   (iv) a substrate temperature being 350°–450° C.; and
   (v) a pressure being 300 Torr—Atmospheric pressure.

15. A method for manufacturing an inter-layer insulating film according to claim 1, wherein said step of forming a $SiO_2$ film comprises the step of forming a layer of nondoped silicate glass as the inter-layer insulating film on the under-layer by chemical vapor deposition utilizing the reaction of ozone with tetraethoxy-silane.

16. A method for manufacturing a semiconductor structure having an inter-layer insulating film consisting of nondoped silicate glass, comprising the steps of:
   preparing a semiconductor substrate;
   forming an element on the semiconductor substrate;
   forming an under-layer in which nitrogen (N) atoms are introduced into the semiconductor substrate and the element; and
   forming the nondoped silicate glass as the inter-layer insulating film on the under-layer by chemical vapor deposition utilizing the reaction of ozone with tetraethoxy-silane.

* * * * *